United States Patent
Fretts

(10) Patent No.: US 9,291,795 B2
(45) Date of Patent: Mar. 22, 2016

(54) OPTICAL VIAS FOR PRINTED CIRCUIT BOARD

(71) Applicant: Flextronics AP, LLC, Broomfield, CO (US)

(72) Inventor: William D. Fretts, Kanata (CA)

(73) Assignee: Flextronics AP, LLC, San Jose, CA (US)

( * ) Notice: Subject to any disclaimer, the term of this patent is extended or adjusted under 35 U.S.C. 154(b) by 176 days.

(21) Appl. No.: 13/973,069

(22) Filed: Aug. 22, 2013

(65) Prior Publication Data

US 2014/0055873 A1    Feb. 27, 2014

Related U.S. Application Data

(60) Provisional application No. 61/692,922, filed on Aug. 24, 2012.

(51) Int. Cl.
*G02B 27/00* (2006.01)
*G02B 7/02* (2006.01)
(Continued)

(52) U.S. Cl.
CPC .. *G02B 7/02* (2013.01); *G02B 6/43* (2013.01); *H05K 1/0274* (2013.01); *H05K 1/181* (2013.01); *H05K 1/144* (2013.01); *H05K 3/366* (2013.01); *H05K 2201/1059* (2013.01); *H05K 2201/10189* (2013.01)

(58) Field of Classification Search
CPC ........................................................ G02B 1/00
USPC ........................................... 359/809; 439/889
See application file for complete search history.

(56) References Cited

U.S. PATENT DOCUMENTS 7,249,981 B2    7/2007  Chen
7,630,601 B2   12/2009  Mershon et al.
(Continued)

FOREIGN PATENT DOCUMENTS

| CN | 1853127 A | 10/2006 |
| CN | 101218713 A | 7/2008 |
| JP | 2009-98223 A | 5/2009 |

OTHER PUBLICATIONS

Bona, G.L. et al. "Characterization of parallel optical-interconnect waveguides integrated on a printed circuit board", Proc. of SPIE vol. 5453, SPIE, Bellingham, WA, pp. 134-141 (2004).
Neyer, A. et al. "Electrical-Optical Circuit Board Using Polysiloxane Optical Waveguide Layer", Electronic Components and Technology Conference, 55th Proceedings, 6 pages (2005).

*Primary Examiner* — James Jones
(74) *Attorney, Agent, or Firm* — Volpe and Koenig, P.C.

(57) ABSTRACT

Described herein are press fit optical vias to interconnect different levels of an electronic or electro-optical device, printed circuit board or connector. A device includes a device level having an optical component and another device level having another optical component. A press fit optical via interconnects the device level and the another device level. A press fit optical includes a barrel having a length for interconnecting between the device level and the another device level, an insertion point at an end of the barrel, and a lens at another end of the barrel. It includes an extraction collar between the lens the barrel, an insertion limit face between the extraction collar and the barrel, and a rotation key extending from the extraction collar and the insertion limit face. A plurality of swages are interposed on the barrel and the insertion limit face.

15 Claims, 10 Drawing Sheets

(51) Int. Cl.
*H05K 1/02* (2006.01)
*H05K 1/18* (2006.01)
*G02B 6/43* (2006.01)
*H05K 1/14* (2006.01)
*H05K 3/36* (2006.01)

(56) References Cited

U.S. PATENT DOCUMENTS

2011/0069464 A1  3/2011  Joe et al.
2012/0019940 A1* 1/2012  Lu et al. ........................ 359/819

* cited by examiner

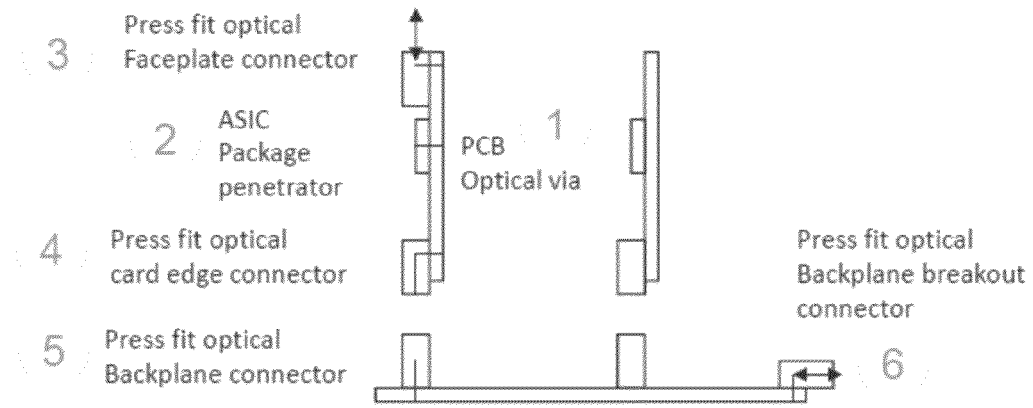
FIG. 1
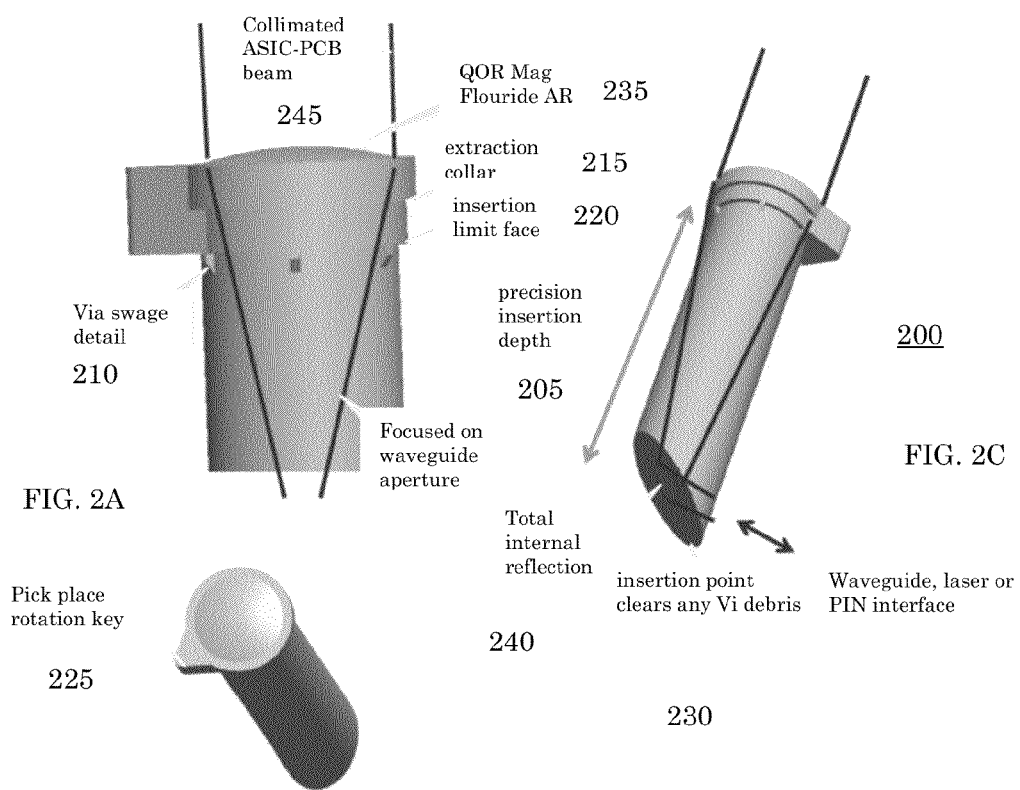

OPTICAL VIAS FOR PRINTED CIRCUIT BOARD

CROSS REFERENCE TO RELATED APPLICATION

This application claims the benefit of U.S. provisional application No. 61/692,922, filed Aug. 24, 2012, the contents of which is hereby incorporated by reference herein.

FIELD OF INVENTION

This application is related to optical interconnects.

BACKGROUND

A printed circuit board (PCB) is used to mechanically support and electrically connect electronic components using conductive pathways etched from metallic sheets that are laminated onto a non-conductive substrate. Most PCBs are double-sided boards or multi-layer boards. These types of PCB boards use plated-through holes, called vias, to connect the conductive pathways on different layers of the PCB.

SUMMARY

Described herein are press fit optical vias to interconnect different levels of an electronic or electro-optical device, printed circuit board or connector. A device includes a device level having an optical component and another device level having another optical component. A press fit optical via interconnects the device level and the another device level. A press fit optical includes a barrel having a length for interconnecting between the device level and the another device level, an insertion point at an end of the barrel, and a lens at another end of the barrel. It includes an extraction collar between the lens the barrel, an insertion limit face between the extraction collar and the barrel, and a rotation key extending from the extraction collar and the insertion limit face. A plurality of swages are interposed on the barrel and the insertion limit face.

BRIEF DESCRIPTION OF THE DRAWINGS

FIG. 1 shows an example applicability of optical vias;

FIGS. 2A, 2B and 2C show an example press fit optical via;

DETAILED DESCRIPTION

Figure 3:
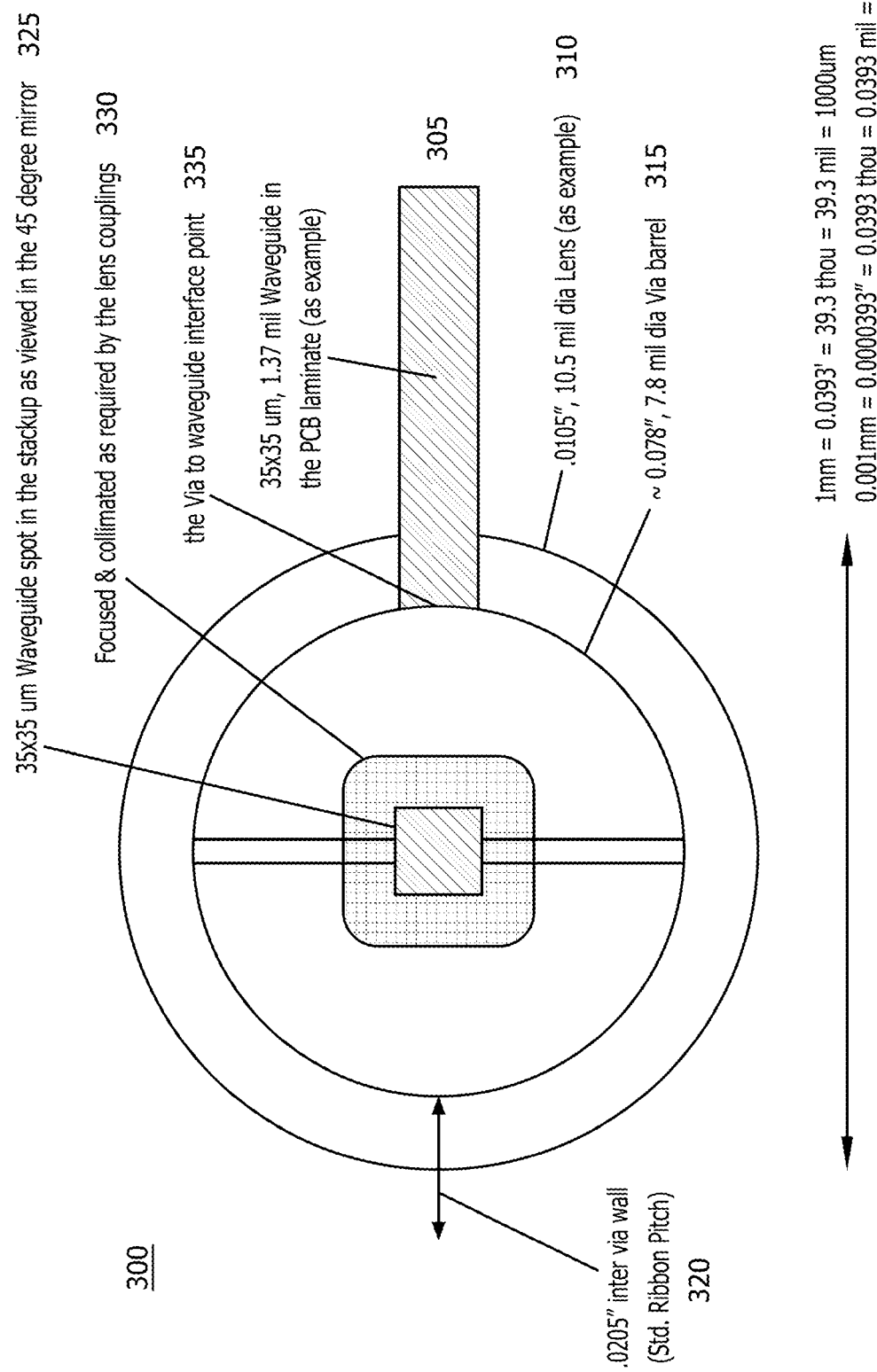
FIG. 3 shows, at a relative scale, looking down a press fit optical via into a planar optical waveguide.

It is to be understood that the figures and descriptions of embodiments of the optical vias for printed circuit boards (PCBs) have been simplified to illustrate elements that are relevant for a clear understanding, while eliminating, for the purpose of clarity, many other elements found in typical PCBs, typical interconnect technology, and in PCBs with embedded planar optical waveguides. Those of ordinary skill in the art may recognize that other elements and/or steps are desirable and/or required in implementing the optical vias for PCBs. However, because such elements and steps are well known in the art, and because they do not facilitate a better understanding of the optical vias for PCBs, a discussion of such elements and steps is not provided herein.

The non-limiting embodiments described herein are with respect to the optical vias for PCBs. The embodiments and variations described herein, and/or shown in the drawings, are presented by way of example only and are not limiting as to the scope and spirit. The optical vias for PCBs may be used in a number of applications.

Current electrical PCB technology has reached or may have reached technology limitations with respect to the type of materials used for PCBs, the aspect ratios of plated PCB vias, plated through hole (PTH) vias standard hole sizes, PCB routing and spacing rules, electrical routing and spacing rules, ball grid array pitch, PCB layer limitations, and human insertion force limitations which impact backplane connector densities and upper limits of information signaling.

However, as electrical input/output performance and signaling densities near fundamental limitations as technology pushes beyond 28 GHz electrical signaling, why use optical interconnects. Optical waveguides have better transmission characteristics, further reach with lower loss at high frequencies, and therefore larger systems can be built. Optical channels can have higher routing densities in the 50-35 um optical trace width range, compared to pure electrical PCBs which are typically require 7-7-7 thou (100-100-100 m) trace widths design rules for effective 28 GHz electrical signaling. Electrical traces are differential, spacing design rules go up as speed increases further beyond 28 GHz. Electrical channels need vias to cross over each other. Optical channels can intersect with little effects, greatly reducing routing layers. Optical channels do not radiate electromagnetic interference (EMI), are not susceptible to noise, and crosstalk, so do not require associated additional ground planes at additional cost. Photons also travel a bit faster than electrons.

PCB technologies are starting to use embedded optical waveguides, optical device topside interconnects and optical device bottomside interconnects. However, issues exist. For example, although optical channels may be micromachined to 45 degree angles to accept a top focused optical interface, effectively completing the via, the micromachining process is very limited in terms of flexibility, difficult to clean, and would be prohibitively expensive in production in a large scale. In addition, it may be difficult to manufacture, difficult to test, not amenable to standard PCB fabrication or standard factory assembly techniques. Moreover, issues have arisen in application specific integrated circuits (ASICs) to waveguide optical connections.

Described herein are press fit optical vias which overcome at least the issues described herein. These press fit optical vias may be used for PCB to application specific integrated circuit (ASIC) connections, ASIC to PCB connections, ASIC to faceplane connections, PCB to backplane connections, backplane to PCB connections, and backplane to backplane connections. For purposes of illustration only, FIG. 1 illustrates that optical press fit PCB-optical connections may be made at different levels. For example, press fit optical vias can be used as PCB optical vias (1), ASIC package penetrators (2), press fit optical faceplate connectors (3), press fit optical card edge connectors (4), press fit optical backplane connectors (5) and press fit optical backplane breakout connectors (6). In another example, press fit optical vias may be used in the integrated circuit (IC) package to allow direct, bottomside connection to high power edge emitting lasers.

The optical via is inspectable, re-workable and testable prior to ASIC attach. The optical via may be built as a single via, duplex via or ganged via assembly to work with standard fiber ribbon pitch emitters, detectors and test cables, which may be 10-12 lanes, for example. An optically clear, index matching lubricant, or even an optical cement, if necessary, makes for reduced optical loss and easier press fit insertions into thick PCBs. Mass optical press fit connectors using this via may be used instead of conventional electrical press fits.

In an illustrative embodiment, to intercept a planar optical waveguide buried in a PCB for vertical optical access, a precision unplated thru hole, (also known referred to as a via herein), is drilled, which effectively terminates the optical waveguide at the edge of the via. If multiple layers of optical waveguides are intercepted by the via, then this forms the foundation for an optical splitter or combiner.

In another illustrative embodiment, press fit optical vias can be used with mirrors to turn a corner. The mirror is press fit into the unplated via by any of several different methods including pick and place factory hardware, manual insertion or press fit anvil. The mirror is made from injection molded, optical quality plastic or glass suitable for the optical wavelengths required, which may be between 1500 and 850 nm, for example. The mirror may have the following characteristics, but is not limited to, a top-side (or bottom-side) collamination lens, limit flange for precision press fit depth, and alignment detail to ensure exact azimuth or insertion angle for mirror-optical via alignment.

In another illustrative embodiment, the mirror may not need to be plated if the optical budget can tolerate the available internal reflection. A more elaborate mirror may allow beamsplitting, (or combining), or polarization splitting, (or combining) within the optical via, for use in multiplexing the optical interfaces or working with multiple layers of PCB embedded optical waveguides. Allowing for some loss through the other side of the via in the splitter may allow for ASIC optical inspection and testing of the finished assembly.

FIGS. 2A, 2B and 2C show a side view, a side perspective view and a top perspective view of an example press fit optical via 200. The press fit optical via 200 can be matched for specific waveguide (WG) depths by sizing the length of a barrel 205 of the press fit optical via 200. Each press fit optical via 200 can include, for example, a via swage detail 210 that preserves the via's critical insertion rotation angle. In particular, the via swage detail 210 secures the optical via 200 from rotating or pulling out during the production and useful life of the product. The via swage detail 210, i.e., flanges, cut slightly into the PCB material. In another embodiment, if optical cement is used, then the via swage detail 210 are not needed, but the resulting via becomes un-reworkable. The press fit optical via 200 further includes an extraction collar 215 for reworking and/or refitting, an insertion limit face 220 for precision depth placement, and a pick-place rotation key 225 for precise alignment. An insertion point detail 230 can clear debris during the insertion operation. The press fit optical via 200 further includes a quarter wave optical thickness (QWOT) Magnesium Fluoride anti reflection coating (AR) convex lens 235 suitable for the operating wavelength and a mirror 240 which provides a total internal reflection face/ surface for directing a beam to or from an optical component, for example, a laser, light emitting diode (LED), PIN, avalance photodiode (APD) detector, or optical waveguide. The AR coating prevents reflections and allows for higher speed optical interfaces.

The press fit optical via 200 can be prepared at a PCB provider during fabrication and can be designed for 8 thou holes (0.008"), on for example, a fiber ribbon pitch. As described herein below, the press fit optical via 200 can be made from precision molded Schott glass optics, which can tolerate PCB thermal solder cycles. The press fit optical via 200 may be pick-place/press-fit after solder stencil, but before solder device placement and reflow.

Functionally, a collimated beam 245 is directed onto the QWOT Magnesium Fluoride AR convex lens 235 and through the barrel 205 to reflect off of the mirror 240 to an optical device or component. Collimation reduces tolerance and contamination sensitivity for the press fit optical via 200.

FIG. 3 shows, at a relative scale, a perspective view by looking down through a press fit optical via 300 into a planar optical waveguide 305. The press fit optical via 300 includes a lens 310, and a barrel 315 allowing for inter via wall PCB support 320 corresponding to a standard ribbon pitch, (which provides for minimum side wall distances allowed between holes). The looking down the press fit optical via 300 perspective view shows a waveguide spot 325 as viewed in a 45 degree mirror and an illustrative focused and collimated beam 330. A press fit optical via 300 and waveguide 305 interface point 335 is also illustrated.

Figure 4:
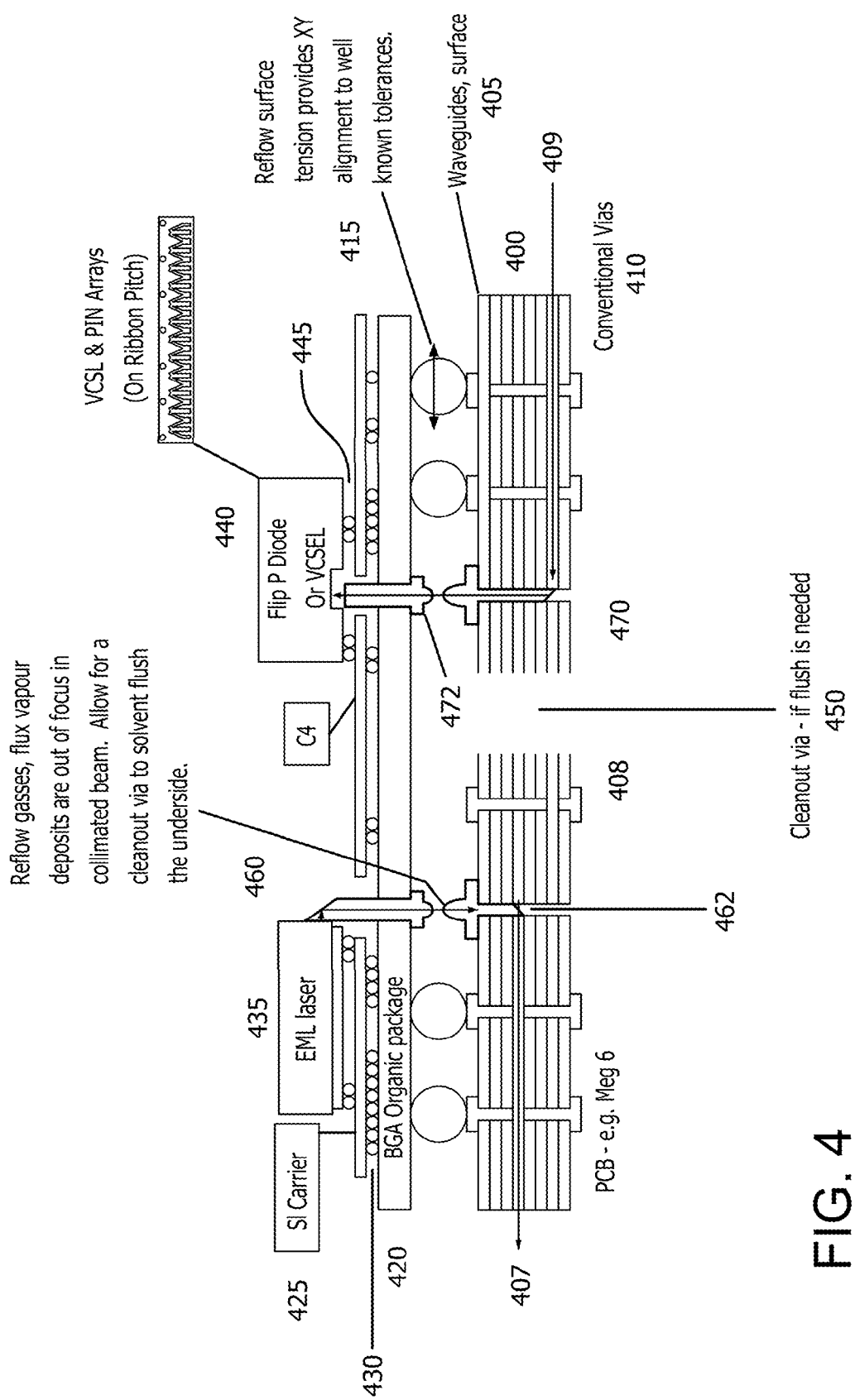
FIG. 4 shows an example use of press fit optical vias with application specific integrated circuits (ASICs)

FIG. 4 shows an example use of press fit optical vias with ASICs. In this example, a PCB 400 has multiple layers that have surface waveguides 405 and buried waveguides 407, 408 and 409. Conventional vias 410 may implemented in the PCB 400 to provide interconnects and soldering positions for solder balls 415 to connect to a ball grid array (BGA) package 420. The BGA 420 is further connected to silicon carriers or substrates 425 using controlled-collapse-chip-connectors (C4) 430 and lasers 435 and 440 are in turn connected to the silicon carriers or substrates 425 via C4 445. A cleanout via 450 may also be implemented to flush out reflow gasses and flux vapour deposits, which may cause the collimated beam to become unfocused or that impair the mirror function, if total internal reflection is used as the mirror method.

Press fit optical via 460 is positioned to receive a beam from laser 435 and direct the beam to another press fit optical via 462, which in turn directs it to buried waveguide 407. Another press fit optical via 470 directs a beam from buried waveguide 409 through press fit optical via 472 to a diode or laser 440. As described herein, the press fit optical vias are cleanable, can be engineered for specified depths, mirrored to make turns, polarized, acts as beam splitters and other like functions.

As shown and described herein, these optical vias are very tiny, and are inserted into 8 thou drilled holes. No optical glue is needed to mount the press fit optical vias, although index matching fluid or lubricant may be used to ease the press fit. Holes can be inspected with bore scope microscope tool. Vias can be inserted on the same pitch as fiber ribbon and are designed to be production inserted with a placement tool with programmable pressure limit and theta control.

Installed links can be checked for optical performance prior to ASIC installation. Optical vias can be extracted with an extraction tool and broken vias can be pushed through the PCB. Optical via links can carry any lambda, or Dense Wavelength Division Multiplexing (DWDM) combination, at any rates allowed for in the optical domain Signal Integrity (SI) In an embodiment, if an ASIC requires rework, the vias may need to be replaced as they interfere with most solder screen processes.

Described herein is how to drill the via to prepare for the press fit optical element(s) and inspect the results. The finished via hole should be as smooth as possible, to minimize losses at the optical via to waveguide interface. In an embodiment, the vias may be polished by mandril and grinding compound to minimize optical losses and reflections at the sidewall. In the optical via design, it is important that no copper pads from the conventional PCB barrel are present in the optical via stack to contribute scratches to the optical via sidewall. The finished holes can be inspected by a mirrored optical micro bore scope. In an embodiment, a custom inspection tool with preset depth flanges and location reticles may be used. In another embodiment, inspection through the lens after fitting may also be done with a backlit waveguide and visible light source. When an external optical fiber or optical fiber ribbon is used in the inspection, it will be possible to run Optical Time Domain Reflectometry (OTDR) to confirm the link quality and insertion loss.

Figure 5:
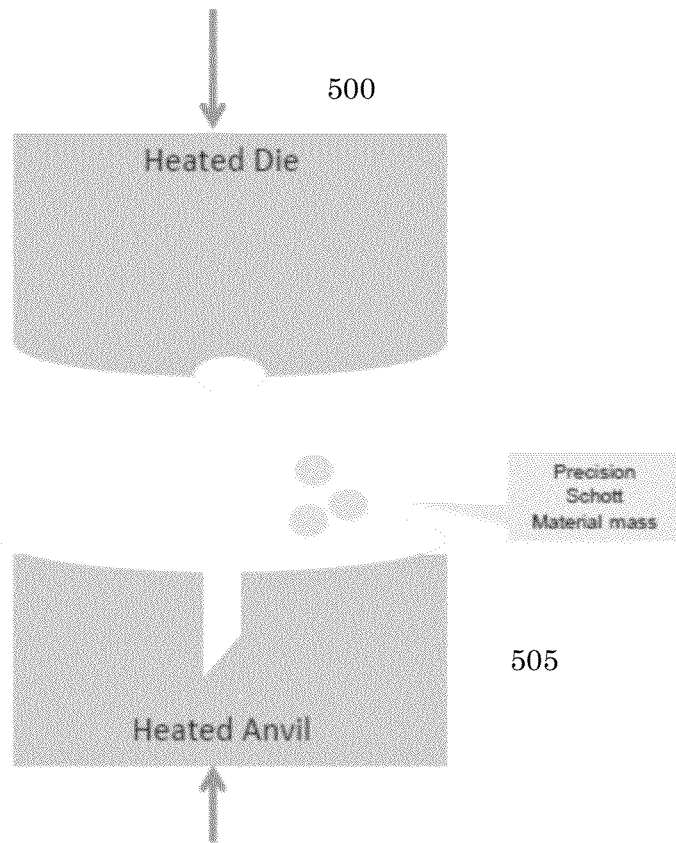
FIG. 5 shows an example of how to form a press fit optical via.

FIG. 5 shows an example of how to form a press fit optical via. Mold shapes are micromachined from metal rods. Any of a number of shapes is possible, including, but not limited to, complex shapes such as curved 45 degrees and aspherics to better adapt the via sidewall shape. Glass material is put into the mold, heated and formed using techniques known to those of ordinary skill in the art. For example, these techniques keep air bubbles from forming in the glass. For example, a die 500 and an anvil 505 are shaped, glass is positioned and the combination is heated to form the optical via. In an embodiment, surfaces can be anti-reflective (AR) coated if necessary. In an embodiment, ×1 or ×12 ribbon ganged vias may be formed using this method. For example, a 12 element via with a preset escape angle may be built and inserted all at one pressing. The ganged design helps improve tolerances from lane to lane. In another embodiment, with dual shot optical mould techniques, the 45 degree angle can be silvered and a deeper protective via formed. For example, the via would be made in 3 steps, with 2 different mold anvils and two different shots. From the point of a conical via including the 45 degree angle in a higher temperature material, mirror the surface with metallization, and shoot the second optical part in glass without reflowing the first. The result is an optical via which may be fully pointed, and where the mirror surface is fully protected and not based on total internal reflection. Beam splitters and combiners can be made the same way with appropriate 45 degree angle coatings.

Figure 6:
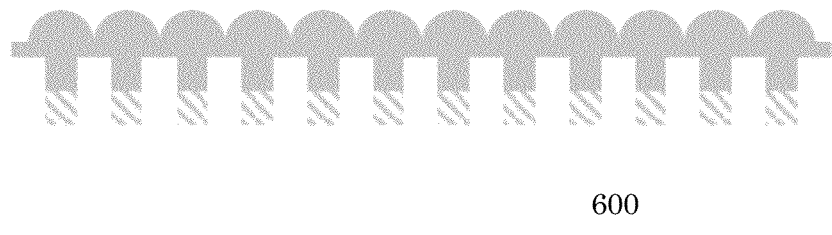
FIG. 6 shows an example of a ganged press fit optical via.

FIG. 6 shows an example of a ganged press fit optical via 600. The ganged press fit optical via 600 may be made using the techniques described herein above but using a more complex mold. The resulting structure may be compatible with 1×12 fiber ribbon strips, for example.

Described herein are the materials that may be used for the press fit optical vias. In an embodiment, optical glass suitable for precision molding may be used for the optical vias. For example, Schott® N-PK52A optical glass may be used, which has a low transformation temperature (Tg) of 467 Celsius and an index of refraction of 1.4952 (nd), (after molding). This is well matched to Dow® Lightpath® materials. It also has an Abbe number of 81.3 (vd), which is a measure of the material's dispersion (variation of refractive index with wavelength) in relation to the refractive index. In another embodiment, high temperature optical plastics may be used. For example, Radel® Hi Temp optical plastic may be used.

Figure 7:
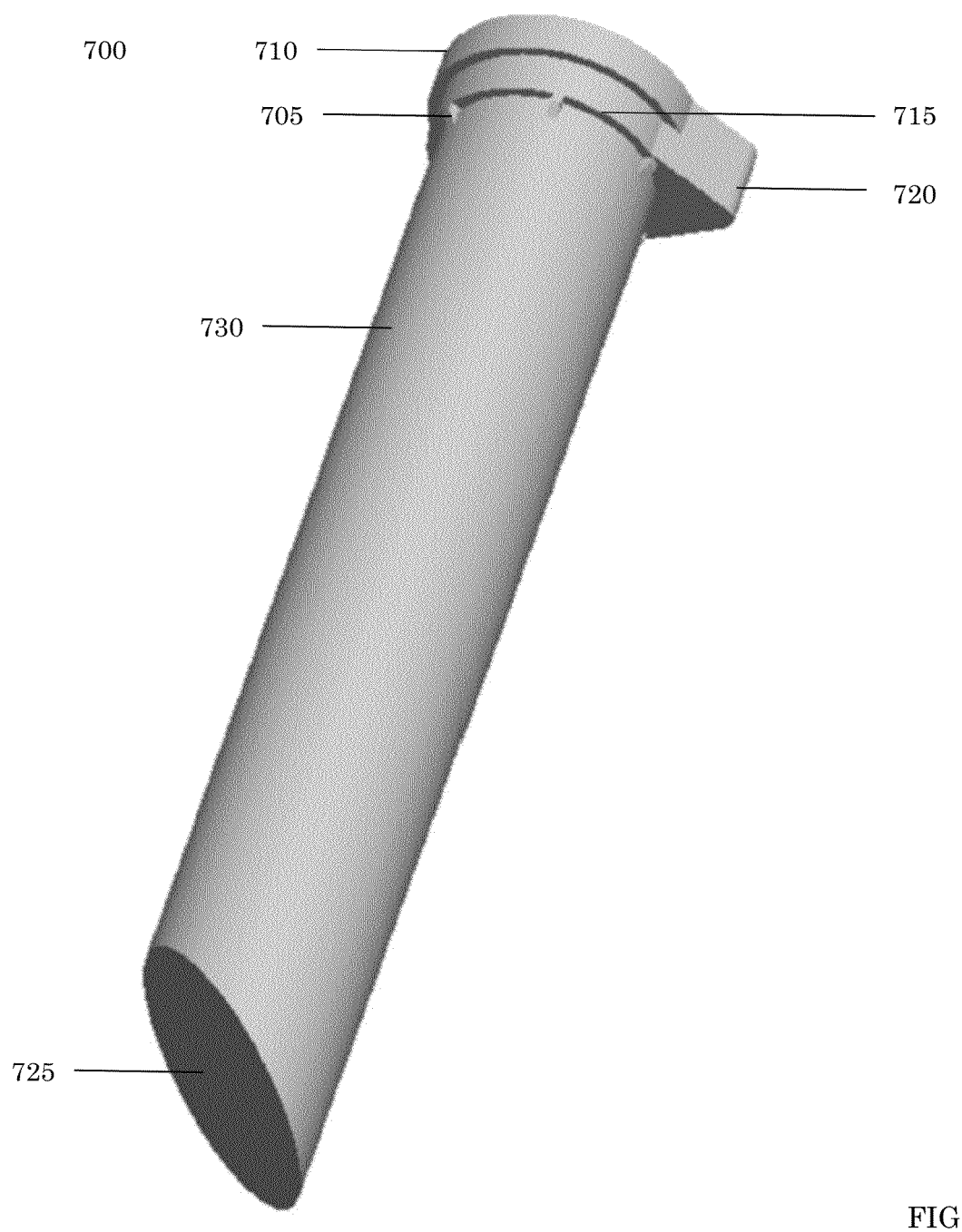
FIG. 7 shows an example optical via for 1092.5 um.

FIG. 7 shows an example optical via 700 for 1092.5 um. As described herein, the optical via 700 includes a swage 705, extraction collar 710, insertion limit face 715, pick-place rotation key 720, mirror 725 and barrel 730. FIGS. 10A, 10B, 10C and 10D show a top view, a side view, another side view and an exploded view of the optical via 700 of FIG. 7.

Figure 8:
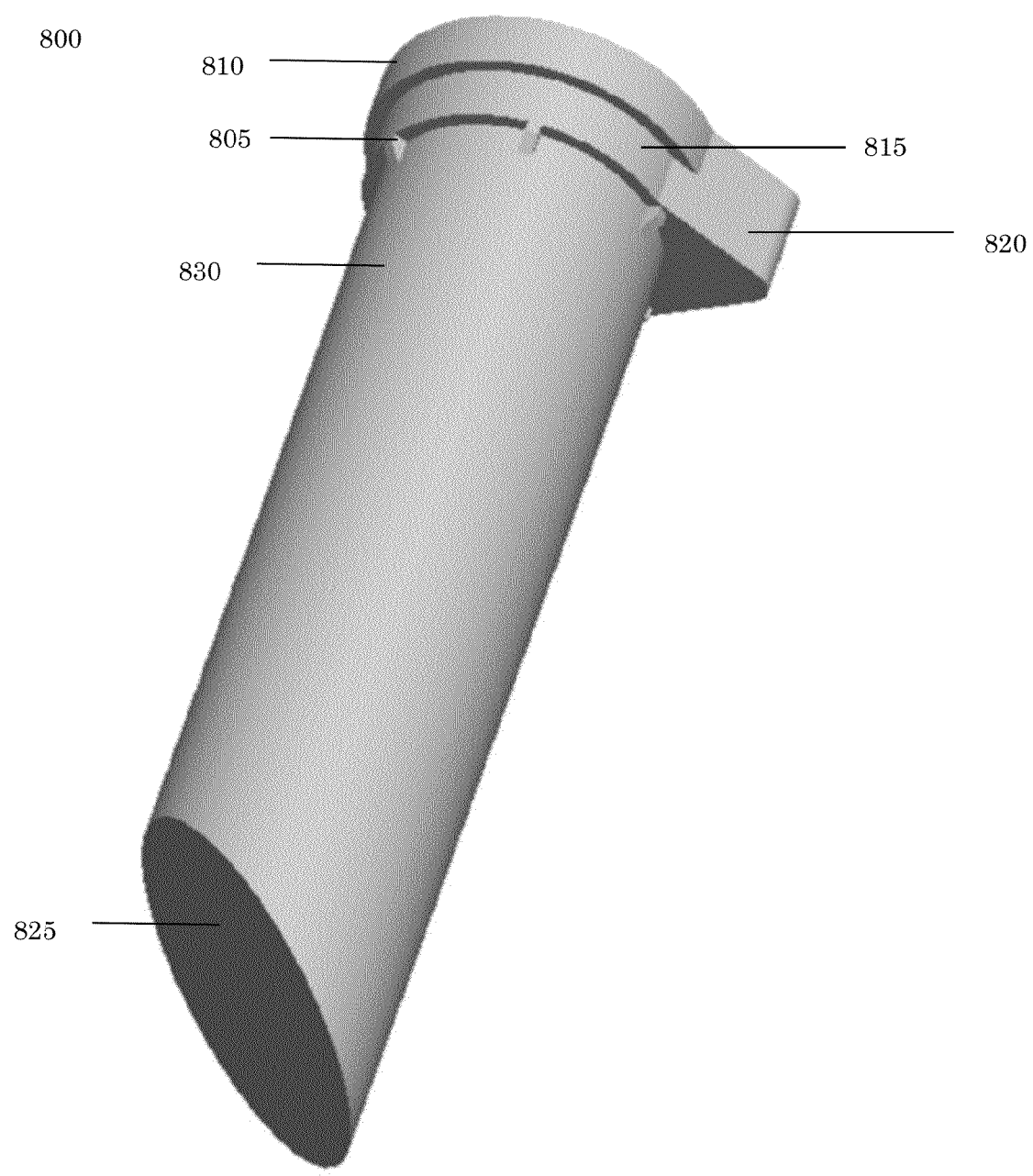
FIG. 8 shows an example optical via for 695 um.

FIG. 8 shows an example optical via 800 for 695 um. As described herein, the optical via 800 includes a swage 805, extraction collar 810, insertion limit face 815, pick-place rotation key 820, mirror 825 and barrel 830. FIGS. 11A, 11B, 11C and 11D show a top view, a side view, another side view and an exploded view of the optical via 800 of FIG. 8.

Figure 9:
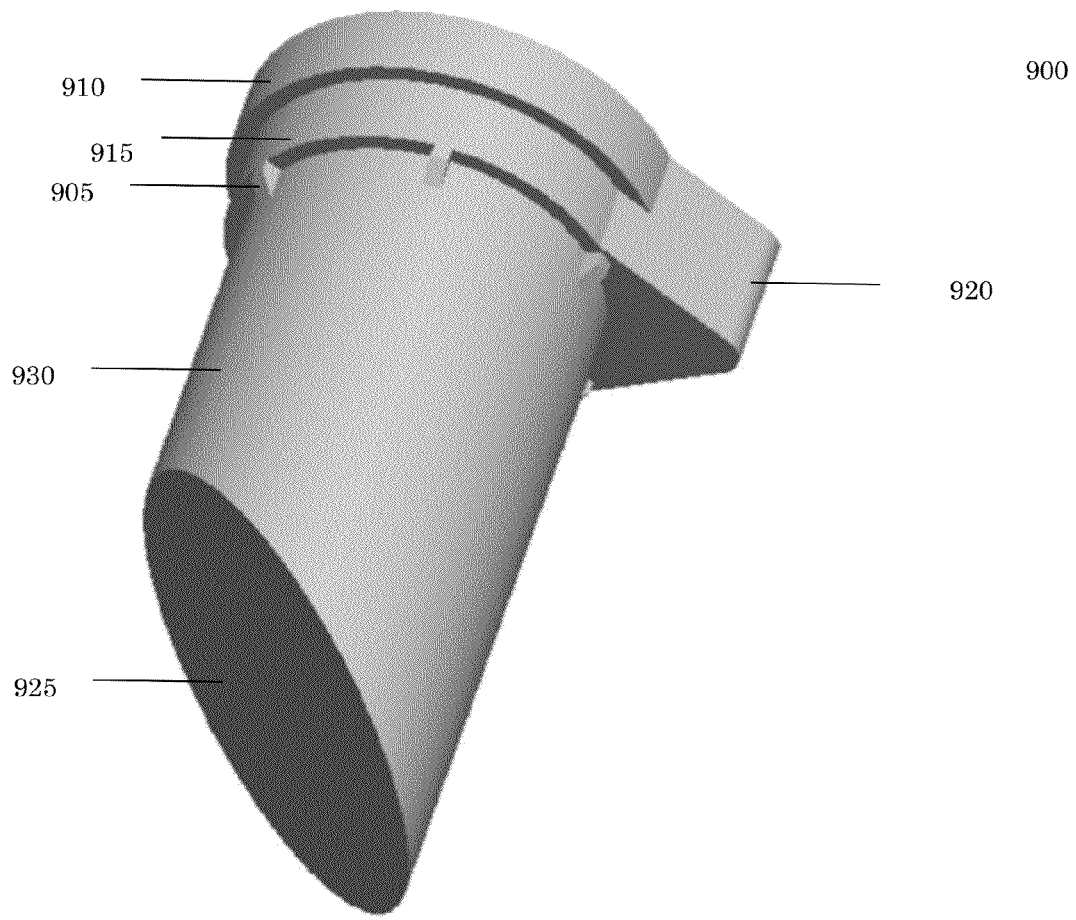
FIG. 9 shows an example optical via for 297.5 um.
Figure 10A:
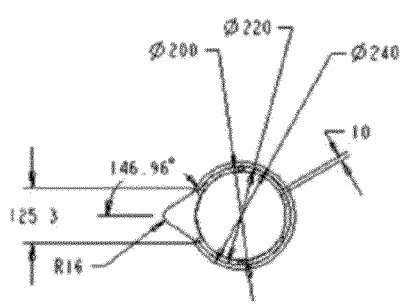
FIGS. 10A, 10B, 10C and 10D shows an example diagram for an optical via.
Figure 10D:
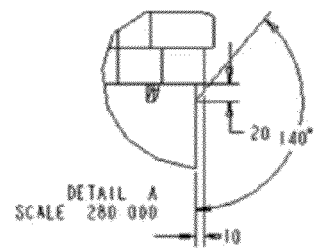
Figure 10B:
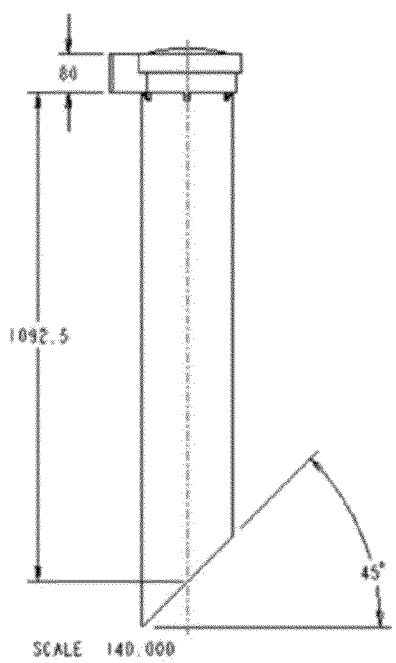
Figure 10C:
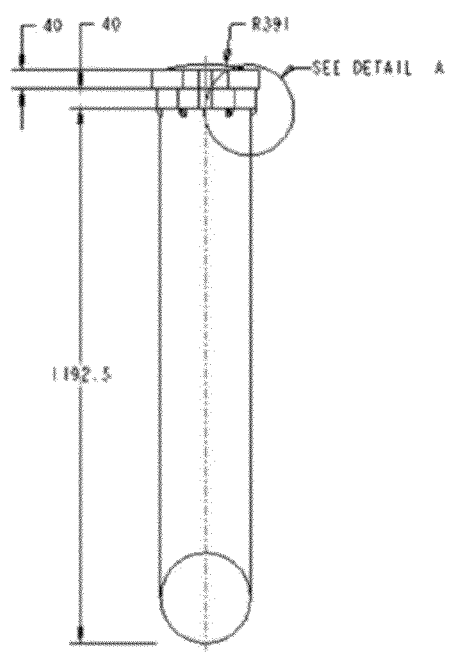
Figure 11A:
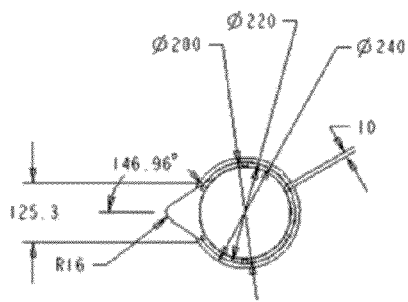
FIGS. 11A, 11B, 11C and 11D shows an example diagram for an optical via.
Figure 11D:
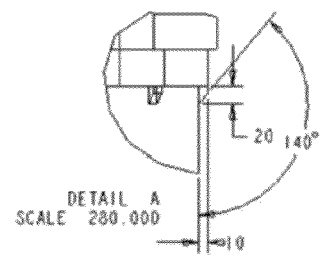
Figure 11B:
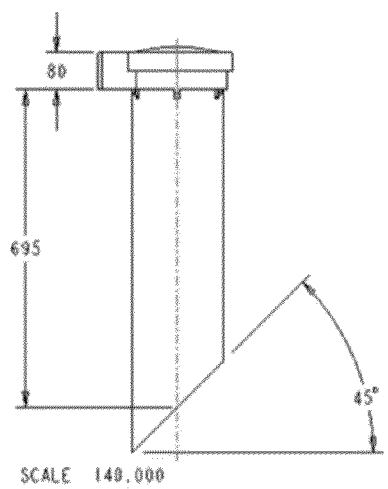
Figure 11C:
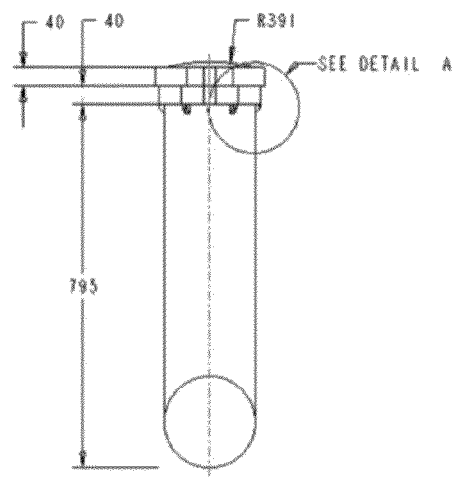
Figure 12A:
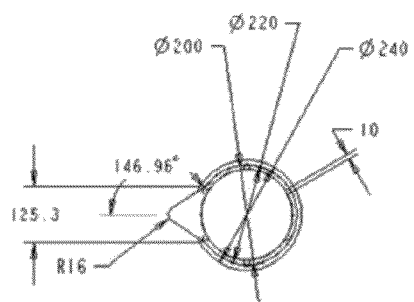
FIGS. 12A, 12B, 12C and 12D shows an example diagram for an optical via.
Figure 12D:
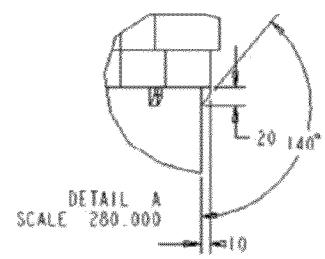
Figure 12B:
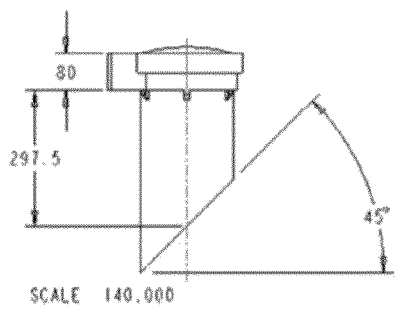
Figure 12C:
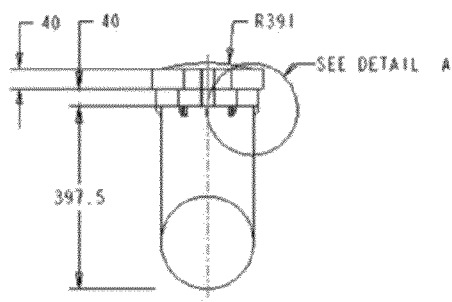

FIG. 9 shows an example optical via 900 for 297.5 um. As described herein, the optical via 900 includes a swage 905, extraction collar 910, insertion limit face 915, pick-place rotation key 920, mirror 925 and barrel 930. FIGS. 12A, 12B, 12C and 12D show a top view, a side view, another side view and an exploded view of the optical via 900 of FIG. 9.

Although features and elements are described above in particular combinations, each feature or element can be used alone without the other features and elements or in various combinations with or without other features and elements.

What is claimed is:

1. A device, comprising:
   a device level having an optical component;
   at least another device level having another optical component; and
   a press fit optical via to interconnect the device level and the at least another device level, wherein the press fit optical further comprises:
   a barrel having a length for interconnecting between the device level and the at least another device level;
   an insertion point at an end of the barrel;
   a lens at another end of the barrel;
   an extraction collar between the lens and the barrel;
   an insertion limit face between the extraction collar and the barrel;
   a rotation key extending from the extraction collar and the insertion limit face; and
   a plurality of swages interposed on the barrel and the insertion limit face.

2. The device of claim 1, wherein the lens has an anti-reflective coating.

3. The device of claim 1, wherein the press fit optical via further comprises:
   a mirror at the end of the barrel configured to provide a total internal reflection surface for directing a beam from the optical component to the another optical component.

4. The device of claim 1, wherein the press fit optical via is re-workable.

5. The device of claim 1, wherein the press fit optical via is a unitary piece.

6. A press fit optical via, comprising:
   a barrel;
   an insertion point at an end of the barrel;
   a lens at another end of the barrel;
   an extraction collar between the lens and the barrel;
   an insertion limit face between the extraction collar and the barrel;
   a rotation key extending from the extraction collar and the insertion limit face; and
   a plurality of swages interposed on the barrel and the insertion limit face.

7. The press fit optical via of claim 6, wherein the lens has an anti-reflective coating.

8. The press fit optical via of claim 6, further comprising:
   a mirror at the end of the barrel configured to provide a total internal reflection surface for directing a beam from an optical component to another optical component.

9. The press fit optical via of claim 6, wherein the press fit optical via is re-workable.

10. The press fit optical via of claim 6, wherein the press fit optical via is a unitary piece.

11. A printed circuit board (PCB), comprising:
a layer having an optical component;
at least another layer having another optical component; and
a press fit optical via to interconnect the layer and the at least another layer, wherein the press fit optical via further comprises:
a barrel having a length for interconnecting between the layer and the at least another layer;
an insertion point at an end of the barrel;
a lens at another end of the barrel;
an extraction collar between the lens and the barrel;
an insertion limit face between the extraction collar and the barrel;
a rotation key extending from the extraction collar and the insertion limit face; and
a plurality of swages interposed on the barrel and the insertion limit face.

12. The PCB of claim 11, wherein the lens has an anti-reflective coating.

13. The PCB of claim 11, wherein the press fit optical via further comprises:
a mirror at the end of the barrel configured to provide a total internal reflection surface for directing a beam from the optical component to the another optical component.

14. The PCB of claim 11, wherein the press fit optical via is re-workable.

15. The PCB of claim 11, wherein the press fit optical via is a unitary piece.

* * * * *